United States Patent
Pipitone et al.

(10) Patent No.: US 7,780,814 B2
(45) Date of Patent: Aug. 24, 2010

(54) WAFER PRE-CLEAN REACTOR CABLE TERMINATION FOR SELECTIVE SUPPRESSION/REFLECTION OF SOURCE AND BIAS FREQUENCY CROSS PRODUCTS

(75) Inventors: John A. Pipitone, Livermore, CA (US); Kenneth D. Smyth, Santa Clara, CA (US); Mei Po (Mabel) Yeung, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 873 days.

(21) Appl. No.: 11/178,118

(22) Filed: Jul. 8, 2005

(65) Prior Publication Data

US 2007/0006972 A1    Jan. 11, 2007

(51) Int. Cl.
*C23C 16/00* (2006.01)
*C23F 1/00* (2006.01)
*H01L 21/306* (2006.01)
*H05B 31/26* (2006.01)

(52) U.S. Cl. .................. 156/345.44; 156/345.43; 156/345.45; 156/345.46; 156/345.47; 156/345.48; 118/723 E; 118/723 I; 315/111.21; 315/111.51

(58) Field of Classification Search ............ 118/723 E; 156/345.43, 345.44, 345.47; 315/111.21
See application file for complete search history.

(56) References Cited

U.S. PATENT DOCUMENTS

| | | | |
|---|---|---|---|
| 5,187,457 A | 2/1993 | Chawla et al. | 333/170 |
| 5,629,653 A * | 5/1997 | Stimson | 333/17.3 |
| 5,855,685 A | 1/1999 | Tobe et al. | 118/723 |
| 5,891,349 A | 4/1999 | Tobe et al. | 216/68 |
| 6,046,546 A | 4/2000 | Porter et al. | 315/111.21 |
| 6,095,084 A * | 8/2000 | Shamouilian et al. | 118/723 E |
| 6,180,019 B1 | 1/2001 | Kazumi et al. | 216/78 |
| 6,252,354 B1 * | 6/2001 | Collins et al. | 315/111.51 |
| 6,485,602 B2 * | 11/2002 | Hirose | 156/345.44 |
| 6,630,792 B2 | 10/2003 | Okumura | 315/111.21 |

(Continued)

FOREIGN PATENT DOCUMENTS

| | | | |
|---|---|---|---|
| JP | 2001-007086 | * | 1/2001 |
| KR | 1998-042054 | | 8/1998 |

*Primary Examiner*—Parviz Hassanzadeh
*Assistant Examiner*—Rakesh Dhingra
(74) *Attorney, Agent, or Firm*—Law Office of Robert M. Wallace

(57) ABSTRACT

A plasma reactor for processing a workpiece in a reactor chamber having a wafer support pedestal within the chamber and process gas injection apparatus, an RF bias power generator coupled to the wafer support pedestal and having a bias frequency, a source power applicator, an RF source power generator having a source frequency and a coaxial cable coupled between the RF source power generator and the source power applicator includes a filter connected between the coaxial cable and the source power applicator that enhances uniformity of etch rate across the wafer and from reactor to reactor. The filter includes a set of reflection circuits coupled between the source power applicator and a ground potential and being tuned to, respectively, the bias frequency and intermodulation products of the bias frequency and the source frequency. The filter may further include a set of filter circuits coupled to the source power applicator and being tuned to, respectively, a second harmonic of the bias frequency and intermodulation products of the second harmonic of the bias frequency and the source frequency.

11 Claims, 7 Drawing Sheets

U.S. PATENT DOCUMENTS

| | | |
|---|---|---|
| 6,707,255 B2 * | 3/2004 | Coumou et al. ........ 315/111.41 |
| 6,770,166 B1 * | 8/2004 | Fischer .................. 156/345.47 |
| 6,777,881 B2 | 8/2004 | Yuzurihara et al. ..... 315/111.81 |
| 2001/0037770 A1 | 11/2001 | Otsubo ....................... 118/723 |
| 2002/0100422 A1 * | 8/2002 | Hilliker ............... 118/723.001 |
| 2002/0149445 A1 * | 10/2002 | Chawla et al. .............. 333/175 |
| 2003/0029567 A1 * | 2/2003 | Dhindsa et al. ........ 156/345.47 |
| 2003/0150562 A1 * | 8/2003 | Quon .................... 156/345.47 |
| 2004/0007984 A1 * | 1/2004 | Coumou et al. ........ 315/111.41 |
| 2004/0035365 A1 * | 2/2004 | Yamazawa et al. ....... 118/723 E |
| 2004/0149221 A1 * | 8/2004 | Koshimizu et al. ...... 118/723 R |
| 2005/0236111 A1 * | 10/2005 | Higashiura ............. 156/345.47 |

* cited by examiner

US 7,780,814 B2

WAFER PRE-CLEAN REACTOR CABLE TERMINATION FOR SELECTIVE SUPPRESSION/REFLECTION OF SOURCE AND BIAS FREQUENCY CROSS PRODUCTS

BACKGROUND OF THE INVENTION

Pre-cleaning of silicon wafers in semiconductor manufacturing is carried out in order to remove a native oxide from the surface of a crystalline silicon wafer prior to deposition or ion implantation steps. Removal of the native oxide is best carried out using plasma processing because it tends to have higher throughput and better uniformity than other techniques. The plasma process version of the wafer pre-clean step can take the form of a reactive ion etch process, with etch precursor gases (e.g., gases containing fluorine or other etch species) being introduced into the chamber. The process requires high throughput because the native silicon dioxide layer to be removed is on the order of 100 Angstroms thick and covers the entire wafer diameter (which may be 200 mm, or 300 mm or 400 mm). The process requires a high degree of uniformity because the native oxide film must be thoroughly removed from the entire wafer without etching the underlying crystalline silicon wafer surface. Therefore, there can be no appreciable deviation in the radial distribution of etch rate across the wafer surface. We have found that an inductive source (an overhead external coil) driven at a low RF frequency (e.g., about 2 MHz) in combination with an HF bias (e.g., about 13.56 MHz) coupled to the wafer through the support pedestal provides the desired etch performance of both high throughput (etch rate) and high uniformity of etch rate radial distribution across the wafer surface.

Attainment of this goal has been hampered by extreme variations in etch rate uniformity among plasma pre-clean reactors of apparently identical design. In producing and testing plasma pre-clean reactors, we have found that while one reactor may provide outstanding uniform radial etch rate distribution across the wafer surface, another reactor of the same design produces such highly non-uniform etch rate distribution that the reactor is not useful. We have found that this problem can be ameliorated on an ad hoc basis by changing the length of the RF coaxial cable driving the inductive coil antenna of a poorly performing reactor. For example, a reactor with poor etch rate uniformity whose nominal design called for a particular length 50-Ohm coaxial cable connected between the source power RF generator output and the coil antenna (e.g., 100 foot, 75 foot or 50 foot length) could be dramatically improved by substituting a different length coaxial cable. For example, one reactor was improved by a change in cable length corresponding to a phase shift of about ⅙ wavelength at the bias power frequency. We deduced from this that the inferior etch uniformity of the poorly performing pre-clean reactors was attributable to the presence of frequencies in the inductive coil antenna other than the source power frequency, i.e., the bias power frequency and frequencies obtained by mixing the source power with the bias power. We confirmed this experimentally by observing the presence of sums and differences of the bias and source power frequencies at the source power RF generator output (coupled back from the plasma through the coil antenna and through the coaxial cable). It is felt that the plasma inside the reactor chamber acts as a mixer of the source and bias frequencies to produce intermodulation products including the fundamental and harmonics of the bias frequency and their sum and difference frequencies ("sidebands") with the source power frequency. These intermodulation products are coupled through the plasma back to the inductive coil antenna.

At first, it was noticed that the presence of frequency components containing the HF bias frequency coupled from the plasma to the coil antenna caused an erroneous indication in the reflected power sensing circuits of the RF generator, causing the generator's power level to be servoed away from a desired level. It is desirable that the reflected power at the generator output constitute less than 5% of the output power. Poor etch performance, due to loss of control over RF power and uncertainty as to the actual applied RF voltage, occurs when the reflected power ratio exceeds 5% (e.g., 10% or more). The plasma-coupled HF frequency components are sensed as reflected power by the LF source power generator's SWR bridge. The magnitude of this problem varied depending upon the manufacturing source of the RF generator, making reactor performance dependent upon the brand of RF generator. This problem was solved by installing a low pass filter at the generator output to block the HF bias frequency and its sidebands with the source power frequency, thereby preventing these components from affecting the generator's SWR bridge. While this solution removed the problem of loss of control over RF power level, it represents a costly modification of an RF generator and it does not fully solve the problem of poor etch rate distribution uniformity.

SUMMARY OF THE INVENTION

A plasma reactor for processing a workpiece in a reactor chamber includes a wafer support pedestal within the chamber and process gas injection apparatus, an RF bias power generator coupled to the wafer support pedestal and having a bias frequency, a source power applicator, an RF source power generator having a source frequency and a coaxial cable coupled between the RF source power generator and the source power applicator. The reactor further includes a filter connected between the coaxial cable and the source power applicator that enhances uniformity of etch rate across the wafer and from reactor to reactor. The filter includes a set of reflection circuits coupled between the source power applicator and a ground potential and being tuned to, respectively, the bias frequency and intermodulation products of the bias frequency and the source frequency. Optionally, the filter may further include a second set of reflection/resonance circuits coupled to the source power applicator and being tuned to, respectively, a second (or greater) harmonic of the bias frequency and intermodulation products of the second (or greater) harmonic of the bias frequency and the source frequency. Optionally, the filter may further include suppression circuits tuned to suppress to ground undesirable frequency components to reduce their presence in the plasma.

DETAILED DESCRIPTION OF THE INVENTION

Figure 1A:
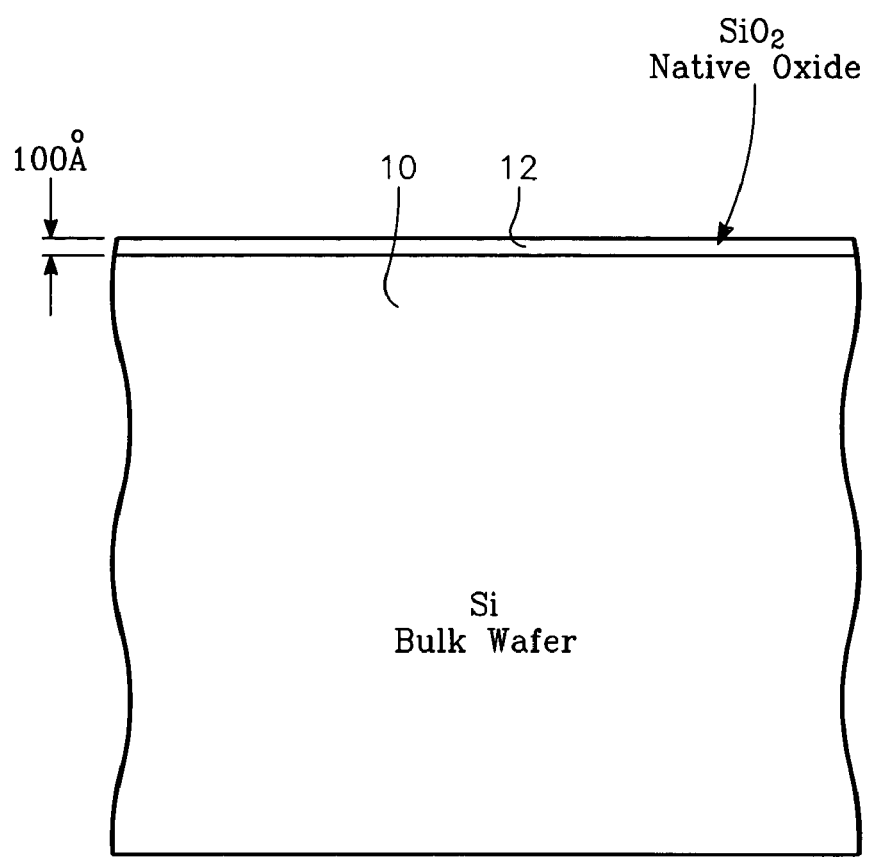
FIGS. 1A and 1B depict a crystalline silicon wafer having a top layer of native oxide.

We have discovered that the presence of HF bias power frequency fundamental and its sidebands with the LF source power frequency at the power generator end of the connection cable is correlated with the occurrence of non-uniform etch rate distribution across the wafer surface in a wafer pre-clean plasma reactor. We have further discovered that the presence (at the power generator end of the connection cable) of the second harmonic of the HF bias power frequency and its sidebands with the LF source power frequency and HF bias power frequency fundamental and its sidebands with the LF source power frequency is correlated with the occurrence of highly uniform etch rate distribution in a wafer pre-clean plasma reactor. This latter indication implies a corresponding reduction in second harmonic power and related intermodulation components in the plasma. In order to exploit these discoveries in a wafer pre-clean plasma reactor having an inductive source power applicator and bias RF power coupled to the wafer, the coaxial cable carrying the RF source power is terminated at the inductive source power applicator in a cable termination circuit which reflects the bias power frequency and its sidebands with the source power frequency back into the inductive source power applicator circuit and supresses its transmission back to the power generator, while allowing selective reflection or dissipation of power at other frequencies. In a preferred embodiment, the cable termination circuit also reflects (enhances) the desirable second harmonic of the bias power frequency and its sidebands with the source power frequency back to the inductive power applicator to enhance their presence in the plasma. The close proximity of the cable termination circuit to the inductive source power applicator (i.e., the coil antenna) guarantees enhancement in the plasma of the bias frequency fundamental and its sidebands while preventing their propagation back to the power generator and controllable enhancement or dissipation in the plasma of the other bias frequency harmonics and sidebands. The reflection of the bias frequency fundamental and its intermodulation components, together with the lack of such reflection of the bias frequency second harmonic and its intermodulation components, boosts the power of the fundamental relative to the second harmonic in the plasma. It is believed this change in the RF power spectrum in the plasma enhanced the etch performance.

The reflection of the bias frequency and its sidebands, as well as the selective reflection or dissipation of other frequencies, guarantees high etch rate distribution uniformity across the wafer surface and eliminates reactor-to-reactor variations in this parameter. A secondary advantage is that reflection of the bias frequency fundamental solves the problem of errors in the reflected power sensing circuits of the RF generator without requiring modification of the generator itself. It was such errors that could cause the generator's power level to be servoed away from a desired level. As a result, reactor performance is not sensitive to variations between RF source power generators of different designs or different manufacturers.

In a preferred embodiment of the cable termination circuit, the suppression at the source power RF generator and enhancement in the plasma of the bias frequency fundamental and its sidebands is carried out by an array of resonant L-C tank circuits coupled between a connection node to the inductive source power applicator and RF ground, each tank circuit being tuned to a different frequency. These frequencies may include the fundamental of the bias power frequency and its upper and lower sidebands with the source power frequency. In accordance with an additional optional feature, the reflection (or suppression) of other frequency components is carried out by a second array of resonant L-C tank circuits coupled to the source power applicator and are tuned to the other frequencies. The other frequencies may include the second harmonic of the bias frequency and its upper and lower sidebands with the source power frequency. For suppression of the other frequencies in the plasma RF spectrum, the second array of tank circuits may be provided with a low impedance path to ground.

Figure 1B:
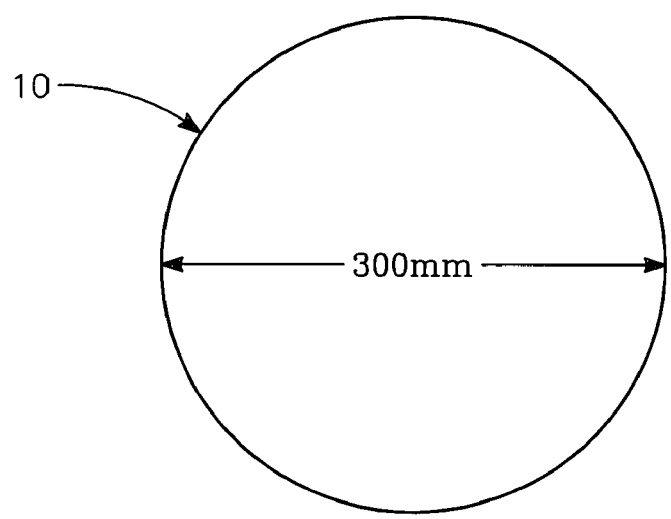

Referring to FIGS. 1A and 1B, a workpiece 10, such as a 300 mm diameter crystalline silicon wafer, has a native oxide film 12 on its top surface that is to be removed prior to semiconductor processing. The native oxide film 12 can have a thickness of about 100-400 Angstroms and covers the entirety of the 300 mm diameter wafer surface. The process step for removing the native oxide can be referred to as a "pre-cleaning" process because it is performed prior to a subsequent process step.

Figure 2:
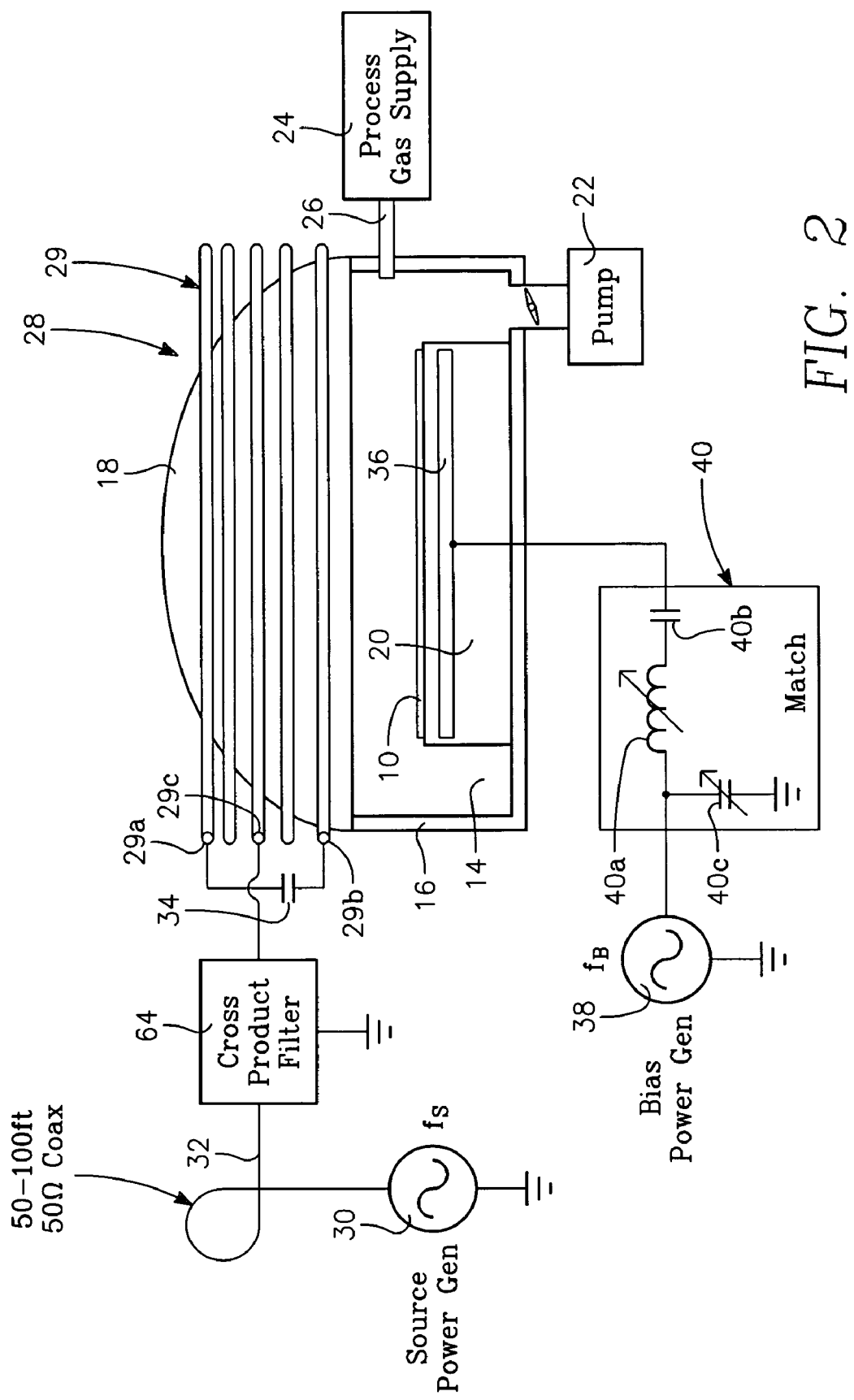
FIG. 2 depicts a plasma wafer pre-clean reactor including a cable termination circuit embodying the invention.

FIG. 2 depicts a plasma reactor suitable for carrying out the pre-clean process step that removes the native oxide film 12 of FIG. 1A. The plasma reactor consists of a vacuum chamber 14 enclosed by cylindrical side wall 16 and a dome-shaped ceiling 18, a wafer-support pedestal 20 within the chamber 14, and a vacuum pump 22 for evacuating the chamber 14. A process gas supply 24 furnishes a process gas or gas mixture into the chamber 14 through gas injection apparatus 26. The gas injection apparatus 26 may be a set of nozzles or injectors, for example. Alternatively, the gas injection apparatus may be an overhead gas distribution plate (not shown) of the conventional type. The process gas includes a precursor of a species capable of etching silicon dioxide. The etch species may be, for example, a fluorine-containing compound mixed with an inert gas such as argon. Various etch species for this application are well-known. RF plasma source power is inductively coupled into the chamber 14 by an inductive antenna 28 consisting of a conductive coil 29 wrapped around the dome ceiling 18 (or wrapped around a portion of the side wall 16).

RF plasma source power is furnished by an RF source power generator 30 whose output is coupled by a cable 32 (such as a coaxial cable) to the coil antenna 28. In accordance with standard practice, the generator 30 has an output impedance of 50 Ohms and the cable 32 has a characteristic impedance of 50 Ohms. A conventional impedance match circuit (not shown) may be connected between the generator 30 and the input end of the coaxial cable 32 or between output end of the coaxial cable 32 and the antenna 28. However, in the embodiment of FIG. 2, the 50 Ohm cable 32 is matched to the antenna 28 at the frequency of the generator 30 by a resonant circuit consisting of a capacitor 34 connected across the two ends 29a, 29b of the coiled conductor 29. The cable 32 is coupled to the coil conductor 29 at a center tap 29c. The impedance match between the generator 30 and the antenna 28 may be optimized by frequency tuning, if desired.

RF plasma bias power is applied to a buried electrode 36 within the wafer support pedestal 20 from an RF bias power generator 38 through a conventional impedance match circuit 40. The bias RF power is coupled from the electrode 36 to the wafer 10. The impedance match circuit 40 is any conventional impedance match circuit of the type well-known in the art, and (for example) may consist of a variable series inductor 40a, a series capacitor 40b and a variable shunt capacitor 40c. The impedance match may be optimized by tuning the variable inductor 40a and variable capacitor 40c, which may be performed automatically during processing using conventional techniques.

In operation, the wafer 10 is placed on the wafer support pedestal 20, and an etchant precursor gas, such as a fluorine-containing gas, flows into the chamber 14 through the gas injection apparatus 26. The pump 22 maintains the chamber 14 at a vacuum pressure (e.g., 50 mT). RF plasma source power (e.g., at a frequency of 2 MHz) is inductively coupled by the antenna 28 into the chamber to produce a plasma over the wafer surface having a large proportion of etchant species ions. Bias power applied from the bias generator 38 (e.g., at 13.56 MHz) to the wafer 10 is absorbed in the plasma sheath and controls ion energy at the wafer surface.

Figure 3:
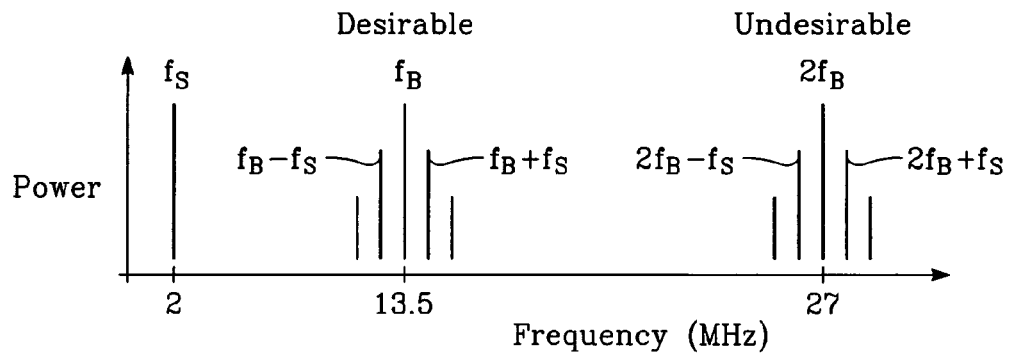
FIG. 3 is a graph depicting the response (vertical axis) of the cable termination circuit in the reactor of FIG. 2 as a function of frequency (horizontal axis).

The plasma in the chamber 14 can act as a mixing medium which mixes the bias power frequency (e.g., at 13.56 MHz) with the source power (e.g., at 2 MHz) to produce intermodulation products including upper and lower sidebands (i.e., 13.56 MHz±2 MHz). The plasma can further couple the bias frequency fundamental and its intermodulation products with the source power frequency to the inductive antenna 28, from which they are coupled back to the source power generator 30. We have discovered that the presence at the RF generator end of the cable 32 of the bias frequency fundamental and its intermodulation products (upper and lower sidebands) with the source power frequency is strongly associated with very poor (non-uniform) etch rate distribution across the wafer surface. We have further discovered that the presence of the bias frequency second harmonic and its source power frequency intermodulation products at the RF generator end of the cable 32 is strongly associated with good etch rate distribution on the wafer. It is felt that this is due to the reduction in the second harmonic power in the plasma because of its diversion to the source power generator 30. The various frequency components and mixing products that can be present in the plasma are depicted in the graph of FIG. 3, in which $f_S$ is the source power frequency (e.g., 2 MHz), $f_B$ is the bias power frequency (e.g., 13.56 MHz).

We have found that a wafer pre-clean plasma reactor of the type illustrated in FIG. 2 exhibits excellent etch rate uniformity across the surface of the wafer 10 whenever the bias frequency fundamental and its intermodulation products are minimum or non-existent at the RF generator end of the RF cable 32. Further, we have found that excellent results are associated with the presence at the RF generator end of the cable 32 of the bias frequency second harmonic and its intermodulation products with the source power frequency.

Figure 4:
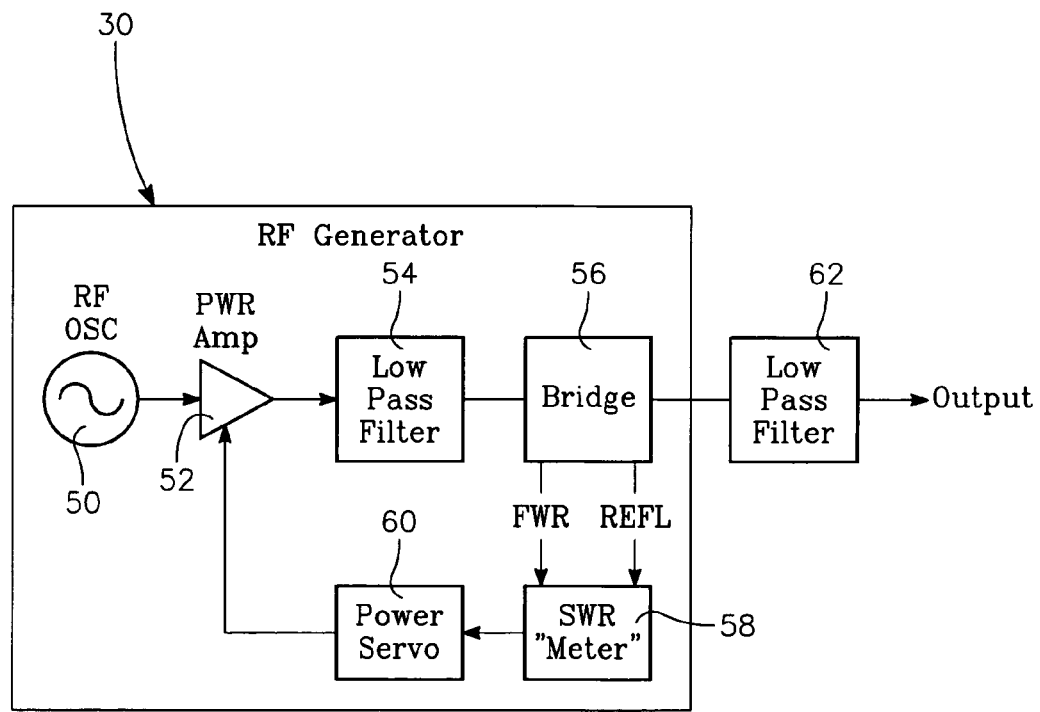
FIG. 4 is a schematic diagram of an RF generator which has been improved with a low pass filter at its output, in accordance with a related aspect of the invention.

One improvement we made in this regard was to render the source power generator 30 impervious to the bias frequency fundamental and its intermodulation products. Referring to FIG. 4, the source power generator 30 typically includes an RF oscillator 50, a power amplifier 52, a low pass filter 54 at the output of the amplifier 52, an SWR bridge circuit 56, and SWR control or meter circuit 58 and a power control circuit 60 that servoes the power level of the power amplifier 52 depending upon the level of reflected power sensed at the SWR bridge 56. The undesirable bias frequency components coupled by the plasma to the inductive antenna 28 travel back to the generator 30 and are sensed at the bridge 56 as "reflected" power, which distorts the operation of the RF power servo elements 58, 60. This problem is solved by the introduction of a low pass filter 62 at the output of the RF source power generator 30 having a pass band near the source power frequency fundamental (e.g., 2 MHz) to stop frequency components containing the HF bias frequency. While this measure solved the problem of RF power control distortion, it does not fully solve the problem of etch rate nonuniformity.

In order to obtain consistent etch rate distribution uniformity from all reactors of the type illustrated in FIG. 2, the present invention reflects at the inductive antenna 28 the bias frequency components (i.e., the bias frequency fundamental and its intermodulation products with the source power frequency) back to the source power applicator (i.e., back to the plasma). In addition, a preferred embodiment of the invention further improves etch distribution uniformity by permitting the bias harmonic (i.e., the bias frequency second harmonic and its intermodulation products with the source power frequency) to be drawn from the source power applicator and through the RF cable 32 to the generator 30. These selective suppression and enhancement features are provided in a cross product filter 64 connected between the output end of the cable 32 and the input node of the inductive antenna 28 (i.e., the center tap 29c).

Figure 5:
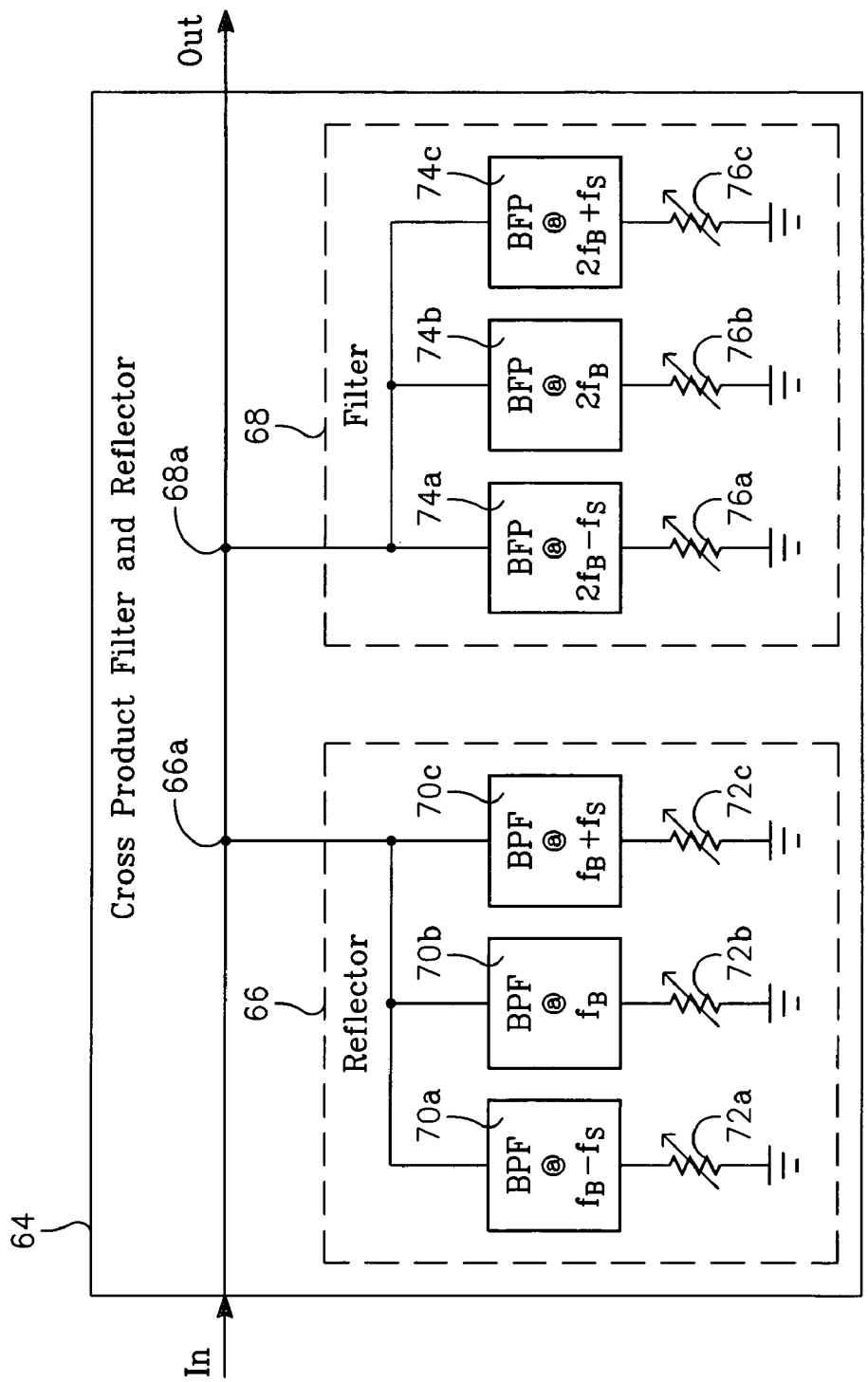
FIG. 5 is a schematic diagram of a preferred embodiment of the cable termination circuit in which reflection (and/or suppression) is performed by a series of L-C resonant tank circuits.
Figure 6:
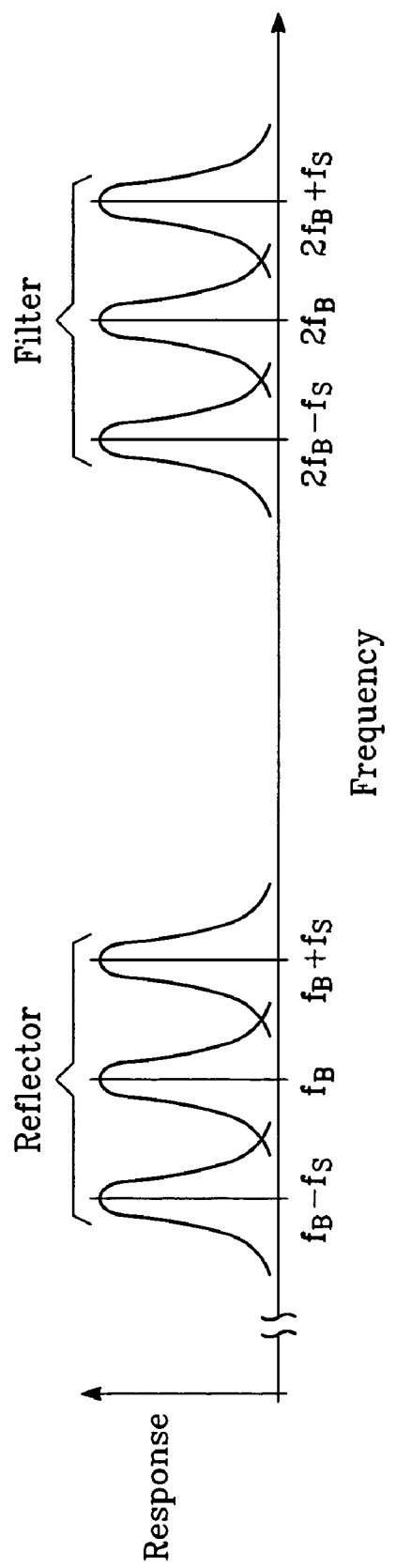
FIG. 6 is a graph depicting the response (vertical axis) of different ones of the tank circuits of FIG. 5 as a function of frequency (horizontal axis).

Referring to FIG. 5, the cross product filter 64 includes two basic elements, namely a reflector 66 and an optional filter 68. The reflector 66 reflects back to the plasma those frequency components whose presence in the plasma is desirable and whose presence at the RF generator 30 is undesirable. The reflector 66 may be implemented as a set of tuned resonant circuits 70a, 70b, 70c that change the impedance at the node 66a, creating a high coefficient of reflection at the node 66a at the frequencies to which the resonant circuits 70a-70c are tuned. Optionally, in case suppression rather than reflection is desired, the resonant circuits 70a-70c may function as resonant traps grounded through variable resistors 72a, 72b, 72c. The variable resistors are optional, but if present may be set to a very low resistance (e.g., near zero Ohms) if suppression rather than reflection is the desired function. Each of the resonant circuits 70a, 70b, 70c is tuned to a particular one of the undesirable frequency components. For example, the traps 70a, 70b, 70c are tuned to $f_B-f_S$, $f_B$, and $f_B+f_S$, respectively. The filter skirts of the individual traps 70a, 70b, 70c are sufficiently steep to maintain separation between them, as illustrated in FIG. 6. The traps 70a, 70b, 70c divert the undesirable frequency components to ground, thereby reducing their power at the inductive antenna 28. This improves the etch rate uniformity exhibited by the reactor. In the reflection mode, the resistors 72a-72c are set to an appropriate resistance, and the change in impedance created by the resonant circuits 70a-70c at the node 66a produces a high reflection coefficient at the node 66a, at the tuned frequencies of the resonant circuits 70a-70c.

The filter 68 may have a similar structure, including a set of resonant tank circuits 74a, 74b, 74c that may (optionally) be coupled to ground through respective variable resistors 76a, 76b, 76c. The resonant circuits 74a, 74b, 74c are tuned to respective ones of the desirable frequency component, while the optional variable resistors 76a, 76b, 76c (if present) are set to an appropriate resistance. For example, the resonant circuits 74a, 74b, 74c are tuned to $2f_B-f_S$, $2f_B$, and $2f_B+f_S$, respectively. As shown in the graph of FIG. 6, the response of each resonant circuit 76a, 76b, 76c is sufficiently sharp to maintain separation between them. The resonant circuits 74a, 74b, 74c resonate at the desirable frequencies. Their characteristics and the resistances of their resistors 76a-76c are set such that there is little or no reflection of their resonant frequencies at the node 68a. Alternatively, if it desired to completely suppress the bias harmonic in the plasma, then the resistors 76a-76c may be set to a very low (or zero) resistance, so that the bias second harmonic and its intermodulation products are trapped to ground.

The combined effect in the plasma of the suppression of the undesirable components by the filter 68 and the enhancement of the desirable frequency components by the reflector 66 produces a consistently high level of etch rate distribution uniformity in a set of wafer pre-clean plasma reactors having the cross product filter 64. In some reactors having highly non-uniform etch rate radial distribution across the diameter of the wafer, the standard deviation of the etch from the wafer center to wafer edge was as much as 6%. Upon introduction of the cross product filter 64, the etch rate standard deviation was reduced to less than 3.5%. Not only is individual reactor performance enhanced, but the reactor-to-reactor performance differences are minimized or eliminated by the cross product filter 64 bringing the performances of all the reactors to a high level of etch rate distribution uniformity.

Figure 7:
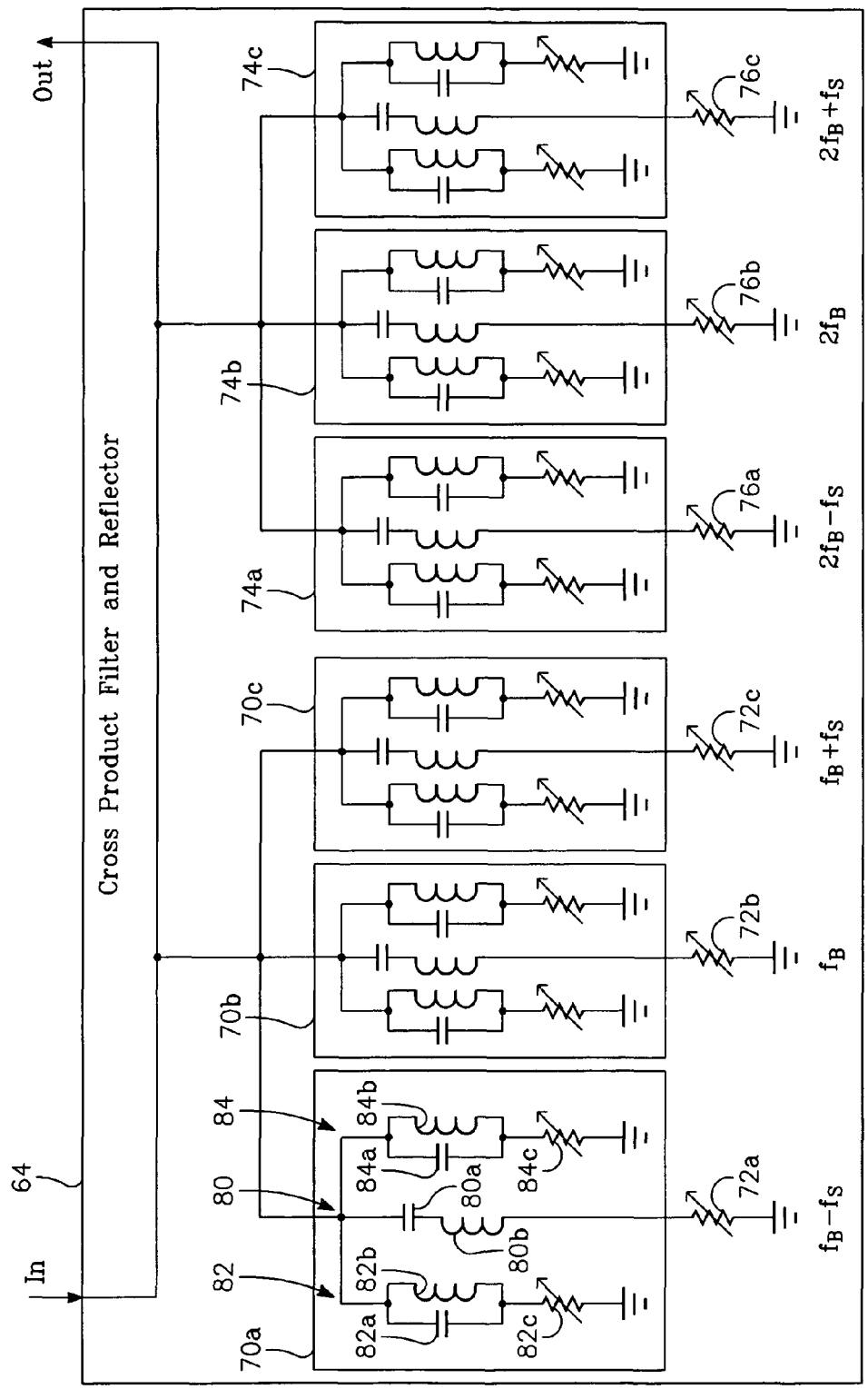
FIG. 7 is a schematic diagram of a circuit embodying the apparatus of FIG. 5.

FIG. 7 illustrates one possible implementation of the embodiment of FIG. 5, in which each trap 70a, 70b, 70c and resonator 74a, 74b, 74c has a common circuit design consisting of first, second and third L-C circuits 80, 82, 84 connected in parallel with one another, the first L-C circuit being connected through the variable resistor (72a or 76a) to ground. The first L-C circuit consists of a series capacitor 80a and a series inductor 80b. The second L-C circuit 82 consists of a parallel capacitor 82a and a parallel inductor 82b connected to ground through a variable resistor 82c. The third L-C circuit 84 consists of a parallel capacitor 84a and parallel inductor 84b connected to ground through a variable resistor 84c. The reference numerals for these elements are shown in FIG. 7 for the bandpass filter 70a, but are typical of all the bandpass filters 70a-70c and for all the resonators 74a-74c.

In one implementation of FIG. 7, the first L-C circuit 80 may be tuned to the exact resonant frequency of the particular bandpass filter or resonator, while the second and third L-C circuits are tuned slightly above and below that frequency, respectively. The values of the variable resistors are selected to sculpt the frequency response around the center frequency.

Figure 8:
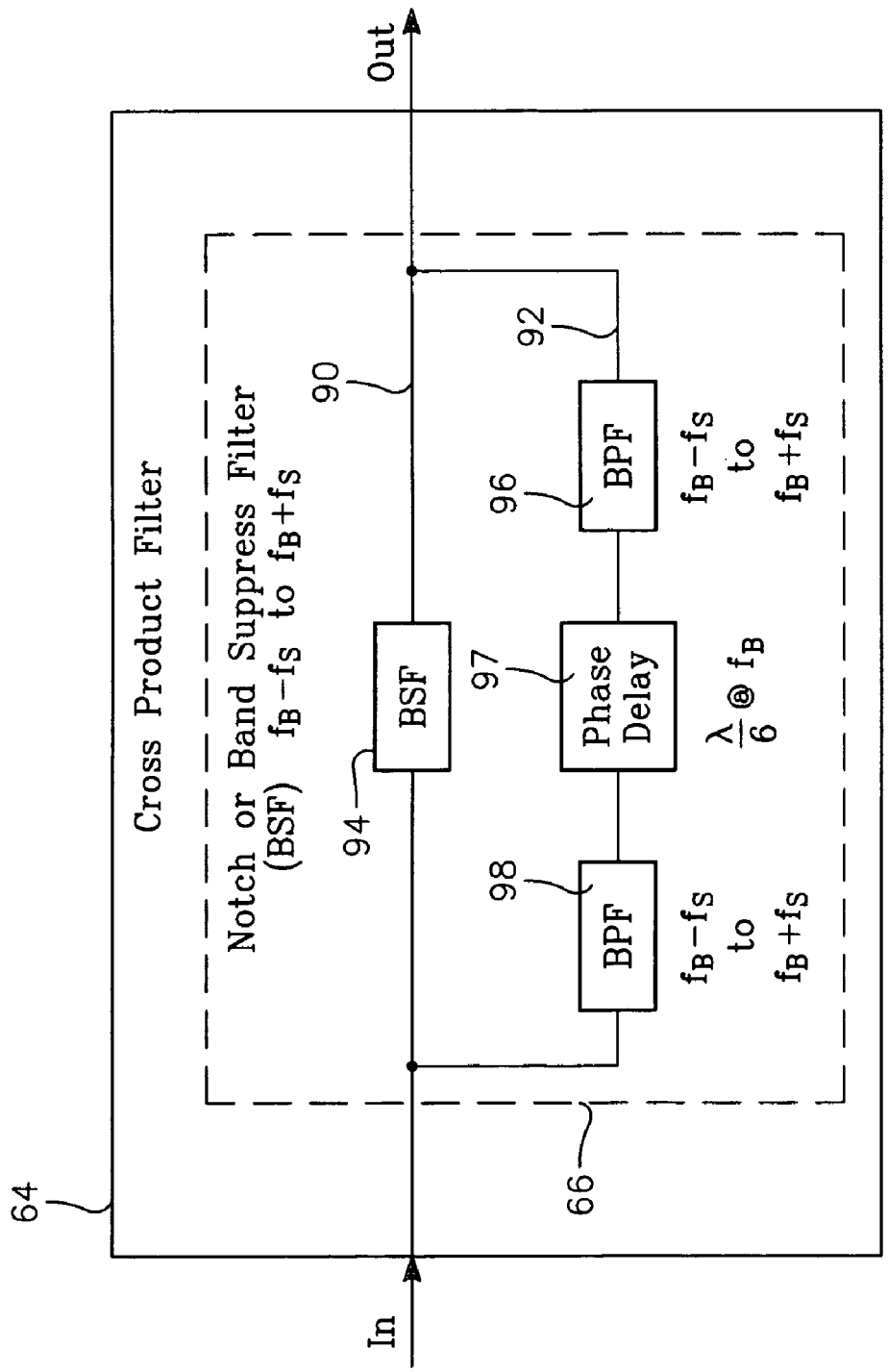
FIG. 8 is a schematic diagram of a first alternative embodiment of the reflection circuitry in which reflection of the bias frequency and its source power frequency side bands is carried out by a phase delay circuit.

FIG. 8 illustrates an alternative embodiment of the cross product filter 64 in which the suppression filter 66 employs phase delays rather than L-C tank circuits. The filter 66 has two parallel branches, namely a main branch 90 and a diversion branch 92 coupled between the input and output. The main branch 90 has a notch or band suppress filter 94 connected in series that blocks the entire range of undesirable frequencies. Thus, the band suppress filter 94 blocks all frequencies between the upper and lower sidebands $f_B \pm f_S$. The diversion branch 92 contains an input bandpass filter 96 whose pass band corresponds to the same frequency range $f_B \pm f_S$ referred to above. The input bandpass filter 96 is followed by a phase delay 97 having the desired delay value for suppressing the bias frequency $f_B$. For example, at $f_B$ this delay may correspond to ⅙ of a wavelength. The phase delay 97 is followed by an output bandpass filter 98 identical to the input bandpass filter 96. In operation, the bias frequency and its related components or sidebands are diverted to the diversion branch, where they are subject to a phase delay that reflects the bias frequency at the inductive antenna 28. The delayed frequency components are then reunited with the other frequency components at the output where the two branches 90, 92 join.

While the invention has been described in detail by specific reference to preferred embodiments, it is understood that variations and modifications thereof may be made without departing from the true spirit and scope of the invention.

What is claimed is:

1. A plasma reactor for processing a workpiece, comprising:
   a reactor chamber having a wafer support pedestal within the chamber and process gas injection apparatus;
   an RF bias power generator coupled to said wafer support pedestal and having a bias frequency;
   a source power applicator;
   an RF source power generator having a source frequency;
   a coaxial cable coupled between said RF source power generator and said source power applicator; and
   a filter connected at a node between said coaxial cable and said source power applicator, said filter comprising:
   (a) a set of plural reflection circuits connected in parallel to said node, a first one of said plural reflection circuits tuned to said bias frequency, a second one of said plural reflection circuits tuned to one intermodulation product of said bias frequency and said source frequency, a third one of said plural reflection circuits tuned to an other intermodulation product of said bias frequency and said source power frequency, wherein the first one, the second one and the third one of the plural reflection circuits are different from each other;
   (b) a set of plural trap circuits connected in parallel to said node and coupled to ground, a first one of said plural trap circuits tuned to a second harmonic of said bias frequency, a second one of said plural trap circuits tuned to one intermodulation product of said second harmonic of said bias frequency and said source frequency, a third one of said plural trap circuits tuned to an other intermodulation product of said second harmonic of said bias frequency and said source power frequency, wherein the first one, the second one and the third one of the plural trap circuits are different from each other.

2. The reactor of claim 1 wherein each of said reflection circuits comprises a resonant circuit tuned to a respective one of said bias frequency, a sum of said bias frequency and said source frequency and a difference between said bias frequency and said source frequency.

3. The reactor of claim 1 wherein each of said trap circuits comprises a resonant circuit tuned to a respective one of (a) a second harmonic of said bias frequency, (b) a sum of said second harmonic of said bias frequency and said source frequency and (c) a difference between said second harmonic of said bias frequency and said source frequency.

4. The reactor of claim 1 further comprising a high resistance path to ground in a range including infinite impedance between said reflection circuits and ground, and a low resistance path to ground in a range including zero impedance between said trap circuits and ground.

5. The reactor of claim 1 wherein each of said reflection circuits and each of said trap circuits comprise a respective phase delay element.

6. The reactor of claim 1 further comprising impedance match circuitry coupled between said source power generator and said source power applicator.

7. The reactor of claim 6 wherein said impedance match circuitry is coupled between said coaxial cable and said source power applicator.

8. The reactor of claim 1 wherein said source power applicator comprises a coil antenna.

9. A plasma reactor for processing a workpiece, comprising:
   a reactor chamber having a wafer support pedestal within the chamber;
   an RF bias power generator coupled to said wafer support pedestal and having a bias frequency;

a source power applicator;

an RF source power generator having a source frequency;

a coaxial cable coupled between said RF source power generator and said source power applicator; and a filter connected between said coaxial cable and said source power applicator, said filter comprising:

a set of plural ungrounded reflection circuits tuned to, respectively, (a) said bias frequency, (b) one intermodulation product of said bias frequency and said source frequency, (c) another intermodulation product of said bias frequency and said source frequency wherein the plural reflection circuits are different from each other, a set of plural grounded trap circuits tuned to, respectively, (d) a second harmonic of said bias frequency, (e) one intermodulation product of said second harmonic of said bias frequency and said source frequency, (f) another intermodulation product of said second harmonic of said bias frequency and said source frequency, wherein the plural trap circuits are different from each other.

10. The reactor of claim 9 wherein each of said reflection circuits and each of said trap circuits comprise a respective resonant circuit.

11. The reactor of claim 10 wherein:

wherein each of said reflection circuits and each of said trap circuits comprise a respective phase delay element.

* * * * *